(12) United States Patent
Kim et al.

(10) Patent No.: US 7,413,943 B2
(45) Date of Patent: Aug. 19, 2008

(54) METHOD OF FABRICATING GATE OF FIN TYPE TRANSISTOR

(75) Inventors: Yong-Sung Kim, Seoul (KR); Tae-Young Chung, Gyeonggi-do (KR); Soo-Ho Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 194 days.

(21) Appl. No.: 11/460,905

(22) Filed: Jul. 28, 2006

(65) Prior Publication Data

US 2007/0023791 A1    Feb. 1, 2007

(30) Foreign Application Priority Data

Jul. 28, 2005    (KR) .................... 10-2005-0069142

(51) Int. Cl.
*H01L 21/336*    (2006.01)
*H01L 31/062*    (2006.01)

(52) U.S. Cl. ...................... 438/197; 257/288

(58) Field of Classification Search ............... 438/259, 438/270, 696, 706, 197, 268, 331, 332, 333; 257/330

See application file for complete search history.

(56) References Cited

U.S. PATENT DOCUMENTS 6,835,618 B1    12/2004    Dakshina-Murthy et al.

FOREIGN PATENT DOCUMENTS

| JP | 7-153944 | 6/1995 |
|---|---|---|
| JP | 11-68069 | 3/1999 |
| KR | 10-2005-0006836 | 1/2005 |

OTHER PUBLICATIONS

English language abstract of Japanese Publication No. 7-153944.
English language abstract of Japanese Publication No. 11-68069.
English language abstract of Korean Publication No. 10-2005-0006836.

*Primary Examiner*—Ha Nguyen
*Assistant Examiner*—Valerie Brown
(74) *Attorney, Agent, or Firm*—Marger Johnson & McCollom, P.C.

(57) ABSTRACT

A method of fabricating a gate of a fin type transistor includes forming hard masks to define active regions of a substrate. A shallow trench isolation method is performed to form a first device separation layer, and then an etch-back process is performed such that the active regions protrude. Sidewall protection layers are formed on sidewalls of the active region, and a second device separation layer is formed thereon, thereby obtaining a device isolation region. The sidewall protection layers include an insulation material with an etch selectivity with respect to an insulation material composing the device isolation region. The device isolation region is selectively etched to form recesses for a fin type active region. Dry etching and wet etching are performed on the silicon nitride to remove the hard masks and the sidewall protection layers, respectively. Gates are formed to fill the recesses.

17 Claims, 10 Drawing Sheets

METHOD OF FABRICATING GATE OF FIN TYPE TRANSISTOR

CROSS-REFERENCE TO RELATED APPLICATIONS

This application claims priority from Korean Patent Application No. 10-2005-0069142, which was filed on 28 Jul. 2005. Korean Patent Application No. 10-2005-0069142 is incorporated by reference in its entirety.

BACKGROUND

1. Field of the Invention

This disclosure relates to manufacturing techniques for semiconductor devices, and more particularly, to a method of fabricating a gate of a fin type transistor.

2. Description of the Related Art

Semiconductor devices are becoming more highly integrated and can be operated at lower power and at higher speed. Particularly, methods have been developed to prevent a short channel effect and improve device reliability. A fin type transistor such as FinFET (Fin Field Effect Transistor) formed using such a method has been introduced to enhance a current characteristic.

A fin type transistor includes a fin type active region. Both sidewalls of the fin type active region can be used as channels, and thus, the current flowing into the channels can be substantially increased.

One exemplary method used to expose the sidewalls of the fin type active region is a FinFET fabrication method implemented with a damascene process. In more detail, device isolation regions defining active regions are formed and then portions of the device isolation regions are recessed to expose the sidewalls of the active regions.

However, when the recesses that expose the sidewalls of the active regions are formed in the device isolation regions, various etching and cleaning processes are generally required. The various etching and cleaning processes can include etching and cleaning processes performed with respect to silicon oxide. Hence, it is often very difficult to prevent etch damage to the silicon oxide layer in the device isolation regions, for example, which mainly includes a silicon oxide layer. As a result, it is also difficult to precisely control the widths of the recesses.

Gate lines are filled in the recesses formed in the device isolation regions so that gates are disposed on the sidewalls of the active regions. However, if the widths of the recesses are larger than the initially determined widths of the recesses, a bridge may be formed between the gate lines, resulting in a defective device operation.

Accordingly, a method to be used to precisely control the widths of recesses and form the recesses exposing sidewalls of active regions defined by device isolation regions is needed. Since the device isolation regions mainly include a silicon oxide layer, a special development of a process and/or etch conditions is required to prevent undesirable etch loss and cleaning loss caused by the silicon oxide layer.

Embodiments of the invention address these and other disadvantages of the conventional art.

SUMMARY

According to embodiments of the invention, a method of fabricating a gate of a fin type transistor precisely controls the width of a recess exposing both sidewalls of an active region when the recess is formed using a damascene process.

BRIEF DESCRIPTION OF THE DRAWINGS

The above and other features and advantages of the invention will become more apparent by describing in detail exemplary embodiments thereof with reference to the attached drawings.

FIGS. 2A and 2B through 10A and 10B are cross-sectional diagrams that illustrate a method of fabricating a gate of a fin type transistor according to some embodiments of the invention.

DETAILED DESCRIPTION

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

According to one exemplary embodiment of the invention, a device isolation region defining active regions is formed, for example, by performing a shallow trench isolation (STI) process. Also, in the present exemplary embodiment, prior to forming a plurality of recesses that expose sidewalls of the active regions to the device isolation region, sidewall protection layers, which can protect the sidewalls of the active regions from subsequent processes, are formed. The sidewall protection layers may be formed as spacers or wings. The sidewall protection layers may be formed of an insulation material that has a specific etch selectivity with respect to silicon oxide. One example of such an insulation material is silicon nitride.

Because of the sidewall protection layers, a cleaning process for silicon oxide can be eliminated from a removal process of hard masks, which are used during the aforementioned STI process performed after the recesses are formed, and a cleaning process. The hard masks can include a silicon nitride layer, and thus, dry etching of the silicon nitride layer can be employed as an etching process that has a specific etch selectivity with respect to silicon oxide, and the silicon nitride layer can be removed by a cleaning process.

Therefore, it is possible to prevent the loss of bar-shaped silicon oxide exposed by the recesses when the hard masks are removed. As a result, the widths of the recesses can be maintained as designed in a photolithography process and a selective etching process.

As described above, the designed widths of the recesses can be precisely maintained. For instance, the width of the silicon oxide bar disposed between the recesses can be maintained to approximately 100 nm. Therefore, when gate lines filling the recesses are formed, it is possible to prevent bridge formation between the gate lines.

Figure 1:
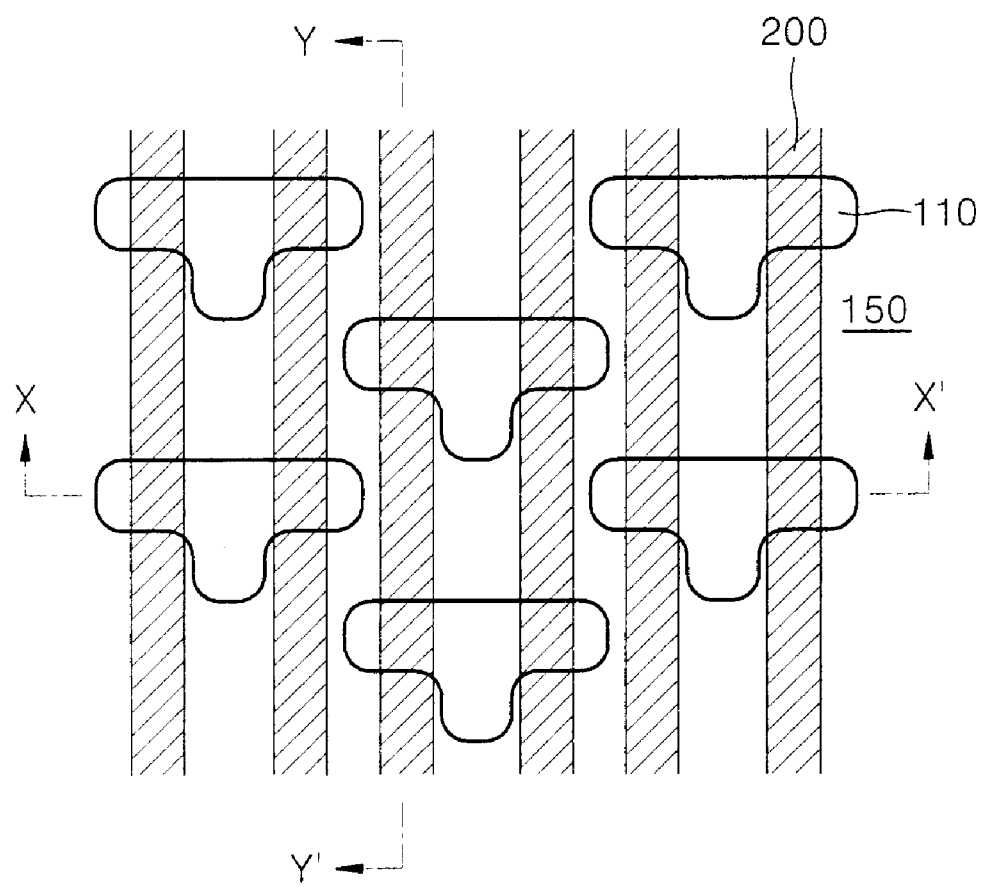
FIG. 1 is a plan diagram that illustrates a layout of a gate of a fin type transistor in accordance with some embodiments of the invention.

FIG. 1 is a plan diagram that illustrates a layout of a gate of a fin type transistor in accordance with some embodiments of the invention.

FIGS. 2A and 2B through 10A and 10B are cross-sectional diagrams illustrating a method of fabricating a gate of a fin type transistor according to some embodiments of the invention. In particular, FIGS. 2A through 10A are cross-sectional views taking along line of X-X' in FIG. 1, while FIGS. 2B through 10B are cross-sectional views taking along line of Y-Y' in FIG. 1.

Figure 2A:
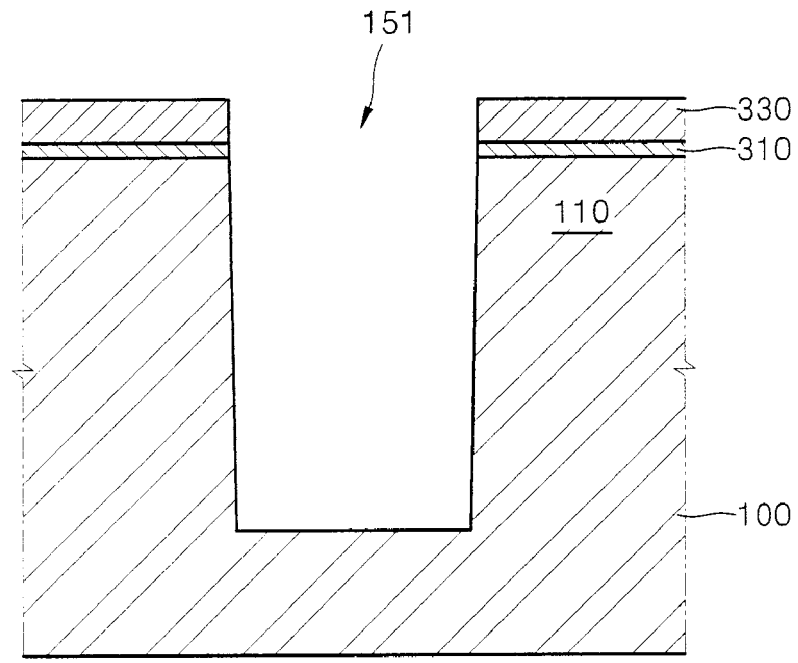
Figure 2B:
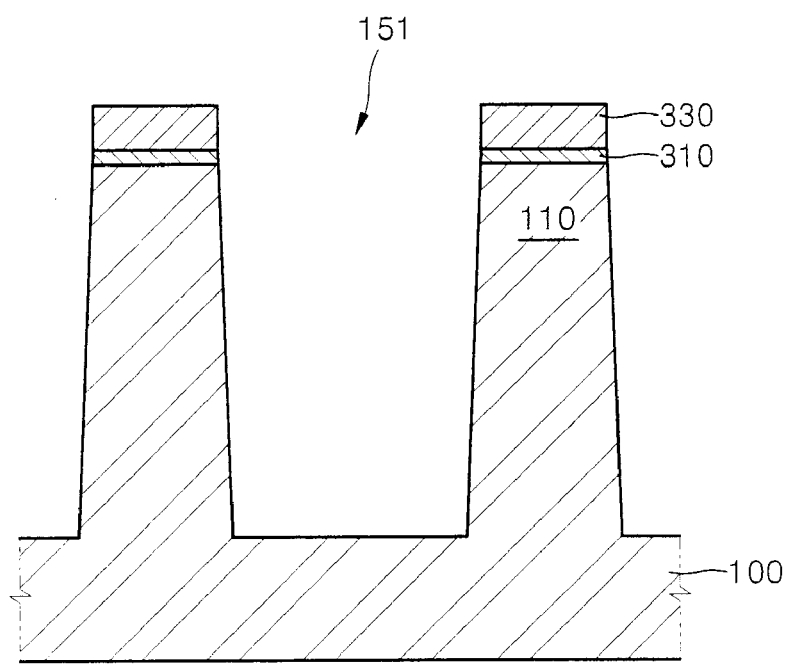

Referring to FIGS. 1, 2A, and 2B, a plurality of device isolation regions are formed to define active regions 110 of a substrate 100. The device isolation regions can be formed using a STI process. More specifically, a pad layer 310 is formed on the substrate 100. The pad layer 310 can include a silicon oxide layer. Then, although not illustrated, a layer for forming hard masks 330 is formed on the pad layer 310. The hard masks 330 are specifically used during the STI process. The layer for forming the hard masks 330 can include a silicon nitride layer and has a thickness ranging from approximately 500 Å to approximately 1,000 Å. The layer for forming the hard masks 330 is patterned by performing a photolithography process and a selective etching process, thereby obtaining the hard masks 330.

Using the hard masks 330 as an etch mask, portions of the substrate 100 are selectively etched to form a plurality of trenches 151. Portions of the substrate 100 masked by the hard masks 330 are defined as the active regions 110. Although the trenches 151 can be formed to various depths depending on the use of devices, the trenches 151 preferably have a depth of approximately 3,000 Å. Also, during the patterning of the portions of the substrate 100, the pad layer 310 is patterned as well.

Figure 3A:
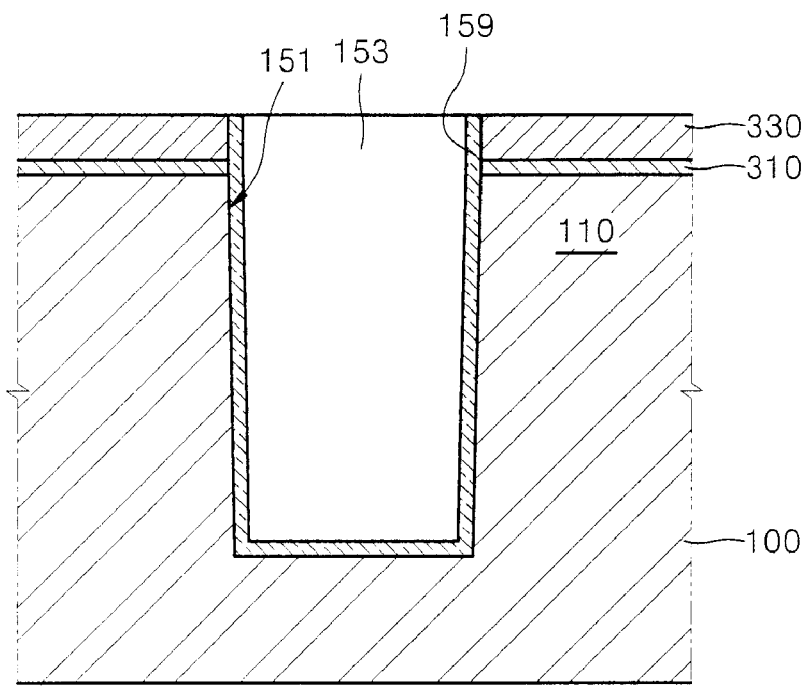
Figure 3B:
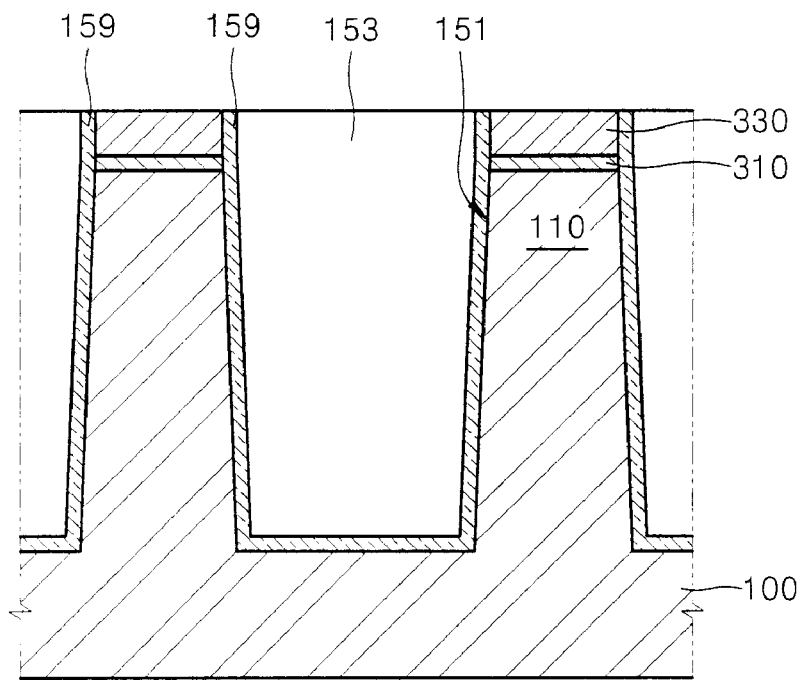

Referring to FIGS. 3A and 3B, a first insulation layer 153 filling the trenches 151 is formed. The first insulation layer 153 can include a silicon oxide layer. A buffer layer 159 can also be formed on sidewalls of the trenches 151 and/or on the bottom surfaces of the trenches 151. The buffer layer 159 can include a silicon nitride layer formed as a liner layer and can further include a silicon oxide layer formed as a liner layer.

The first insulation layer 153 is planarized by performing a planarization process, thereby obtaining a plurality of separated first insulation layers 153. The planarization process can be a chemical mechanical polishing (CMP). Particularly, the hard masks 330 are used as a planarization stop point. Although the employed CMP process can remove a portion of the hard masks 330, the completed hard masks 330 preferably have a thickness of approximately 500 Å.

Figure 4A:
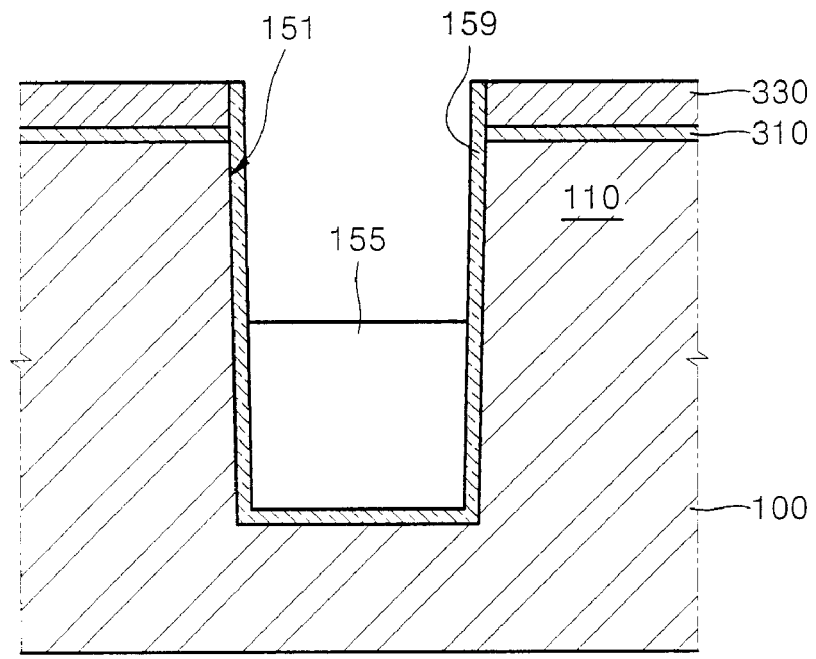
Figure 4B:
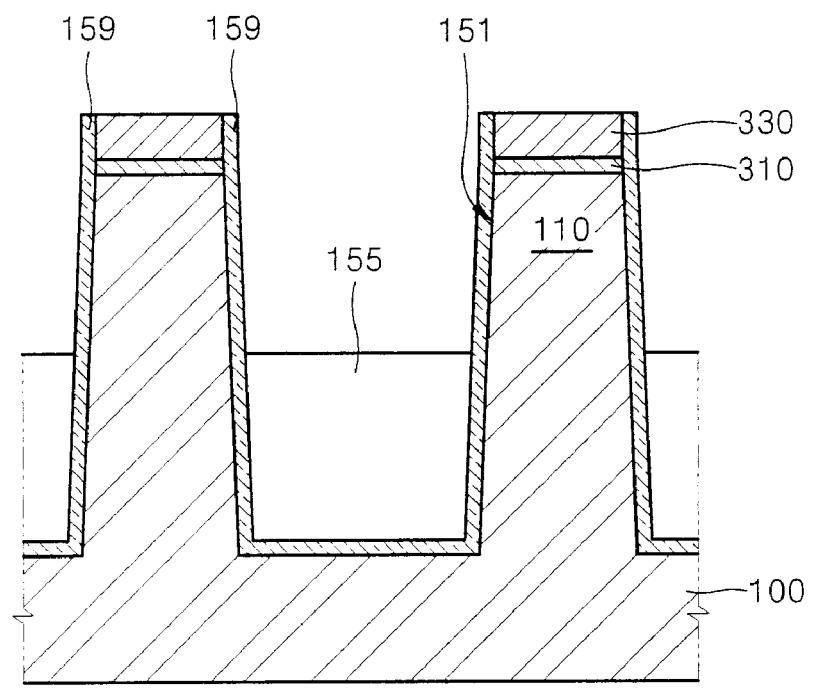

Referring to FIGS. 4A and 4B, a selective etch-back process is performed on the plurality of separated first insulation layers 153 such that the sidewalls of the active regions 110 are exposed. After the selective etch-back process, a plurality of first device separation layers 155 are formed. At this time, the heights of the first device separation layers 155 are lower than the heights of the active regions 110.

The first device separation layers 155 can be recessed such that the heights of the active regions 110 protruding in the form of a mesa are equal to the desired heights of active fins to be formed in a subsequent process. For instance, if the active fins are to have heights of approximately 1,500 Å, the depth to which the first device separation layers 155 are recessed can be approximately 1,500 Å.

The selective etch-back process of recessing the first device separation layers 155 can be a wet etching process using the hard masks 330 as an etch mask. The hard masks 330 can remain at a thickness of approximately 500 Å and thus, the depth to which the first device separation layers 155 are recessed by the etch-back process is approximately 2,000 Å considering that the thicknesses of the first device separation layers 155 are approximately 1,500 Å.

Therefore, the wet etching process can be used to etch a target more deeply. Through the above wet etching process, the first device separation layers 155 are recessed, and the buffer layer 159 may remain on the sidewalls of the active regions 110.

Figure 5A:
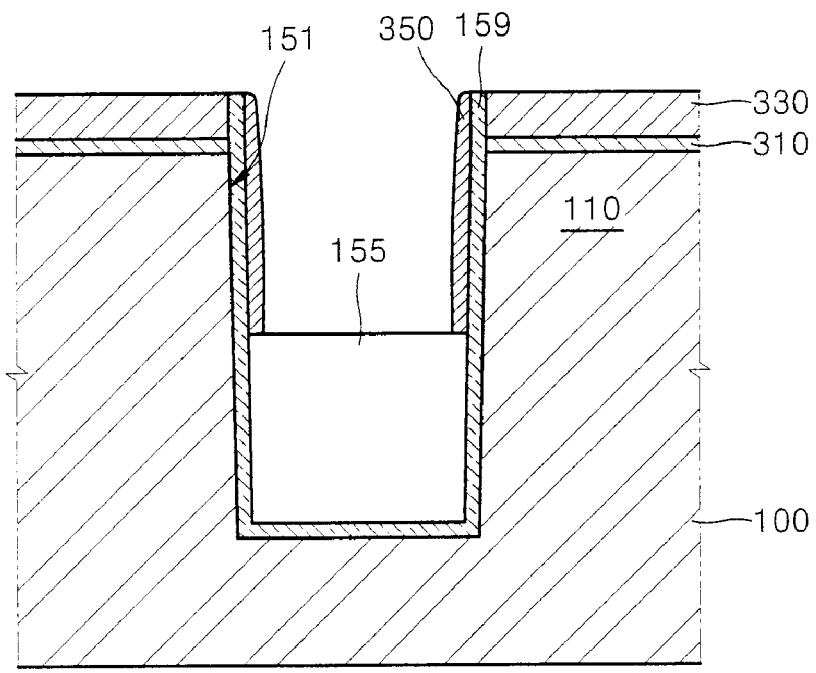
Figure 5B:
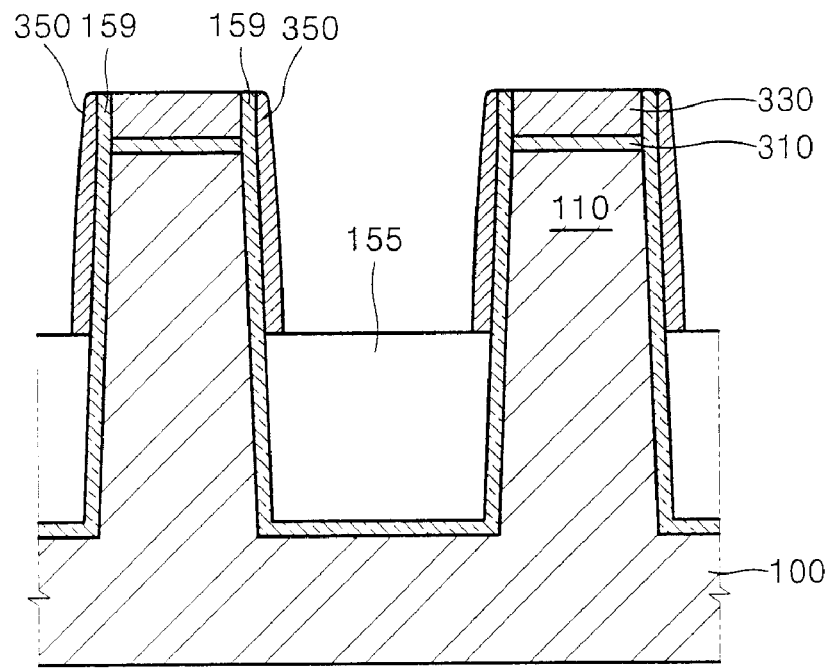

Referring to FIGS. 5A and 5B, a plurality of sidewall protection layers 350 are formed on portions of the sidewalls of the active regions 110 exposed by the recessed first device separation layers 155. The sidewall protection layers 350 can be patterned in the form of a spacer or a wing and can include an insulation material having an etch selectivity with respect to silicon oxide.

According to some embodiments, the sidewall protection layers 350 are formed by forming a silicon nitride layer on the first device separation layers 155. The silicon nitride layer is then anisotropically dry etched to remove portions of the silicon nitride layer. As a result, the silicon nitride layer is patterned in the form of a spacer or a wing covering the sidewalls of the trenches 151 (i.e., the sidewalls of the active regions 110).

The sidewall protection layers 350 are formed on the lateral sides of the active regions illustrated in FIG. 1 to encompass the active regions 110. Also, as illustrated in FIGS. 5A and 5B, the sidewall protection layers 350 are formed to extend along the lateral sides of the trenches 151 such that the sidewall protection layers 350 contact the upper surfaces of the first device separation layers 155.

The sidewall protection layers 350 can be formed to various thicknesses. However, according to some embodiments of the invention, when the individual active region 110 has a width of approximately 100 nm, the silicon nitride layer preferably has a thickness of approximately 73 Å.

Figure 6A:
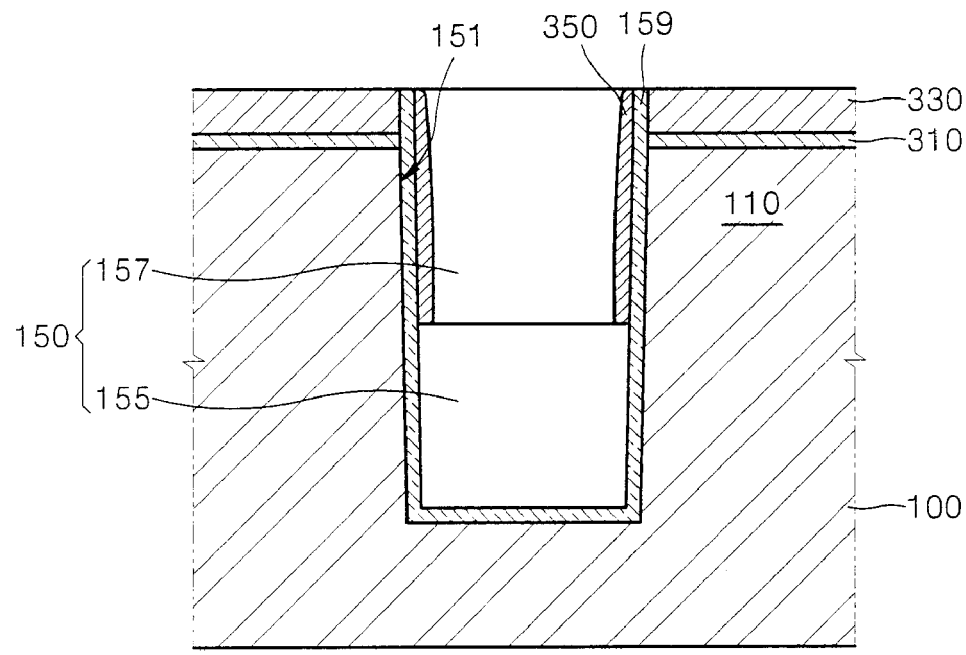
Figure 6B:
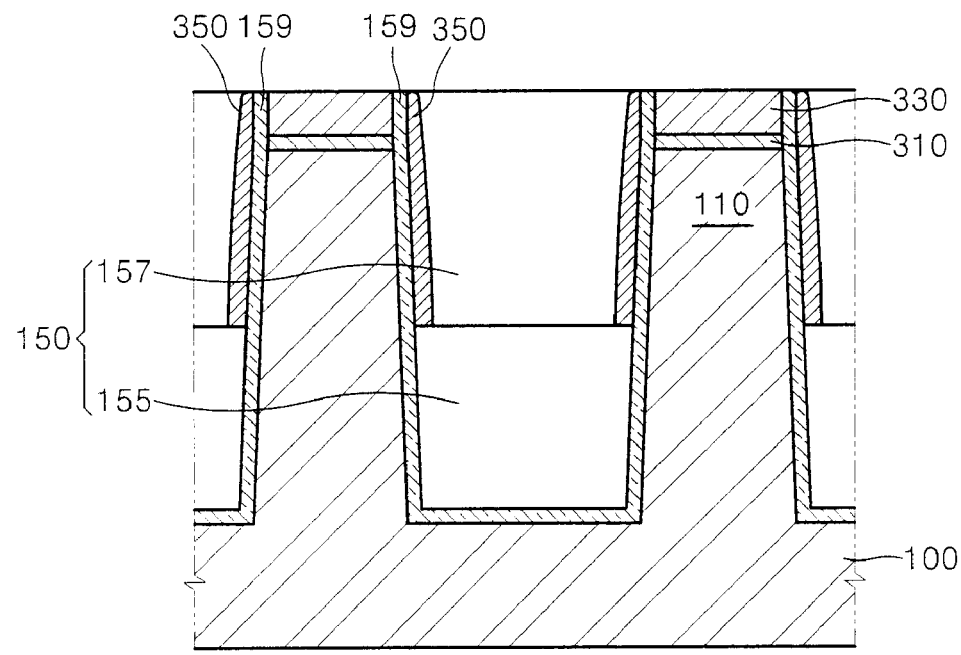

Referring to FIGS. 6A and 6B, although not illustrated, a second insulation layer is formed between the sidewall protection layers 350. The second insulation layer fills gaps generated between the hard masks 330 when the first device separation layers 155 are formed. The second insulation layer can be formed of a silicon oxide layer deposited using a high density plasma (HDP) deposition method, which has a good gap-fill characteristic.

The second insulation layer is planarized using, for example, a CMP process, thereby obtaining second device separation layers 157. The hard masks 330 can be used as a polishing stop point of the CMP process. A plurality of device isolation regions 150 each including the first device separation layer 155 and the second device separation layer 157 can be formed to define the active regions 110 illustrated in FIG. 1.

Figure 7A:
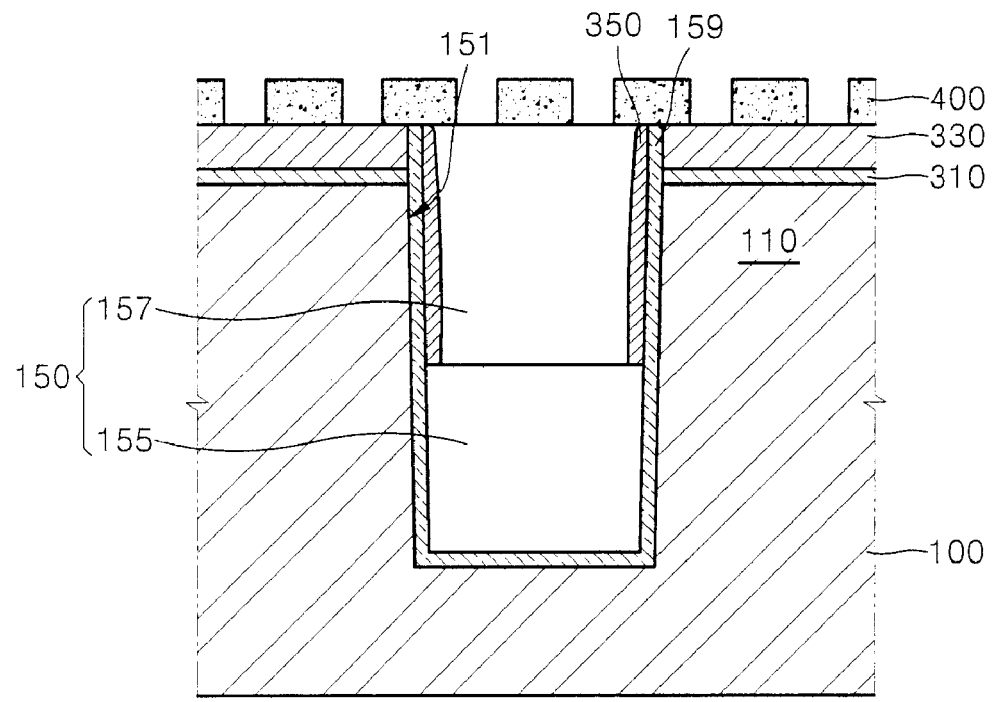
Figure 7B:
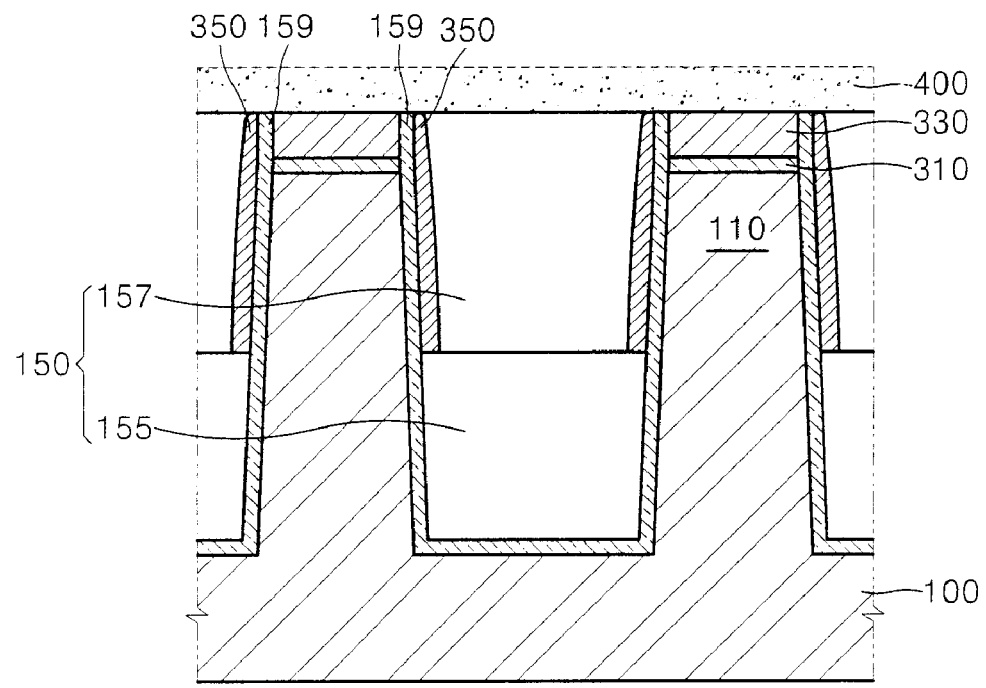

Referring to FIGS. 7A and 7B, an etch mask pattern 400 is formed on the device isolation regions 150. The etch mask pattern 400 will be used as an etch mask during a selective etching process for forming recesses inside the device isolation regions 150 to form the active regions 110 having a fin type. The etch mask pattern 400 can be a photoresist pattern formed using a photolithography process.

Figure 8A:
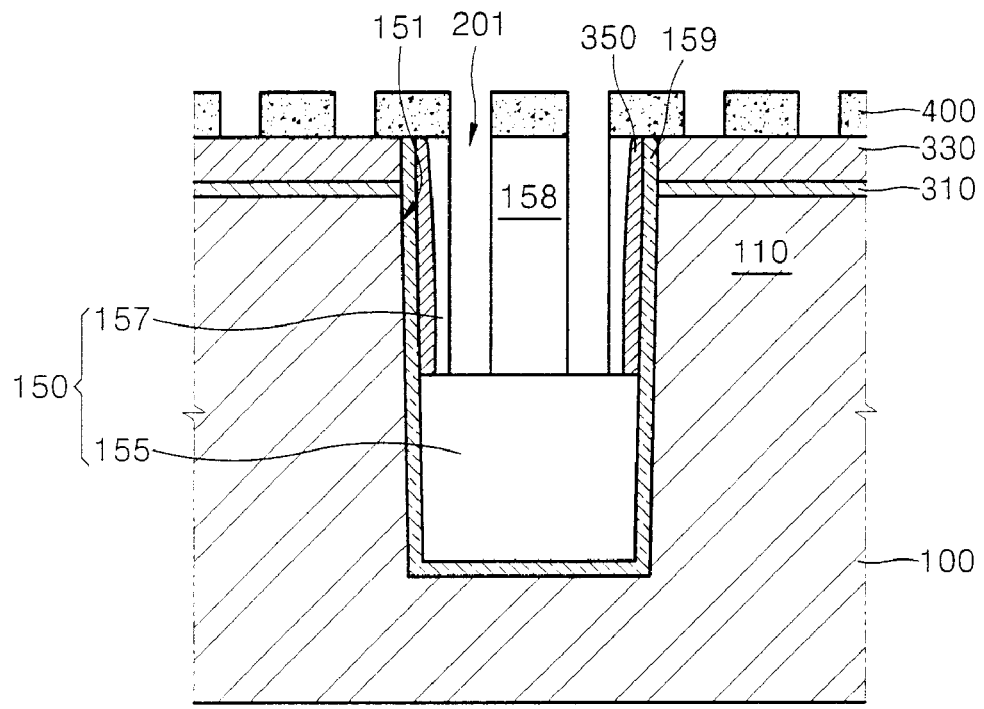
Figure 8B:
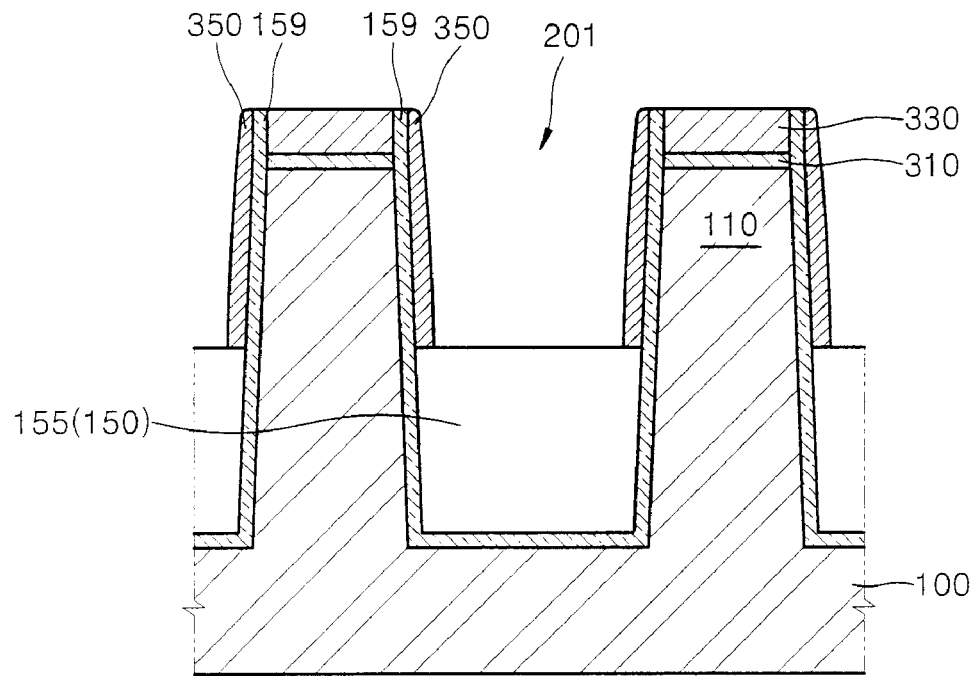

The etch mask pattern 400 can be formed in a line & space pattern exposing regions where a plurality of gates 200 are to be formed (refer to FIG. 1). Thus, the photoresist pattern exposes regions extending in the direction in which the gates 200 extend. Accordingly, the photoresist pattern extends on the hard masks 330 and exposes portions of the device isolation regions 150. Referring to FIGS. 8A and 8B, the device isolation regions 150 exposed by the etch mask pattern 400 are selectively etched to form the recesses 201. That is, the recesses 201 are formed within the device isolation regions 150 using a damascene technique. The widths of the recesses 201 can be set to be substantially same as line widths of the gates 200 (refer to FIG. 1). The silicon oxide layer included in each of the device isolation regions 150 can be anisotropically dry etched to form the recesses 201.

Particularly, the anisotropic dry etching process can be performed to have a specific etch selectivity ratio for the device isolation regions 150 with respect to the photoresist pattern used as the etch mask pattern 400. Also, the anisotropic dry etching process has a specific etch selectivity for the device isolation regions 150 with respect to the silicon nitride layer included in each of the hard masks 330 exposed by the etch mask pattern 400. As a result, the anisotropic dry etching process does not damage the active regions 110 disposed underneath the hard masks 330. Furthermore, the anisotropic dry etching process has specific etch selectivity for the device isolation regions 150 with respect to the silicon nitride layer included in to the sidewall protection layers 350. Thus, the anisotropic dry etching process can be performed such that the sidewalls of the active regions 110 underneath the sidewall protection layers 350 are not exposed.

The recesses 201 can be formed to the depths to which the sidewall protection layers 350 extend. That is, the recesses 201 can be formed to a depth that the first device separation layers 155 are exposed by selectively removing exposed portions of the second device separation layers 157. Therefore, the recesses 201 expose the sidewall protection layers 350. Since the heights of the sidewall protection layer 350 depend on the recessed depth of the individual first device separation layer 155, the recesses 201 can have depths of approximately 1,500 Å that allows the exposure of the sidewall protection layers 350.

Figure 9A:
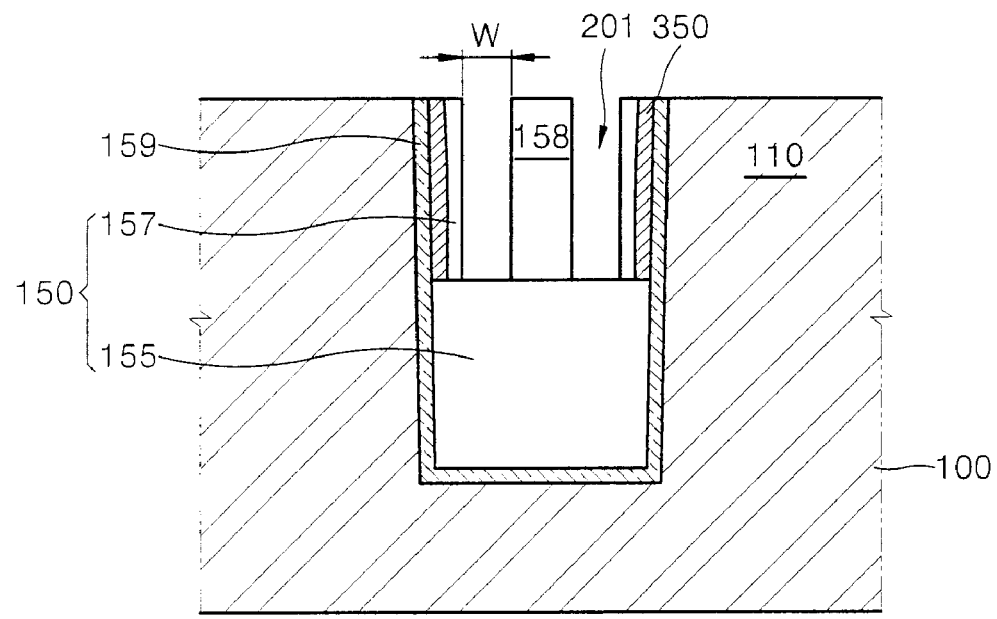
Figure 9B:
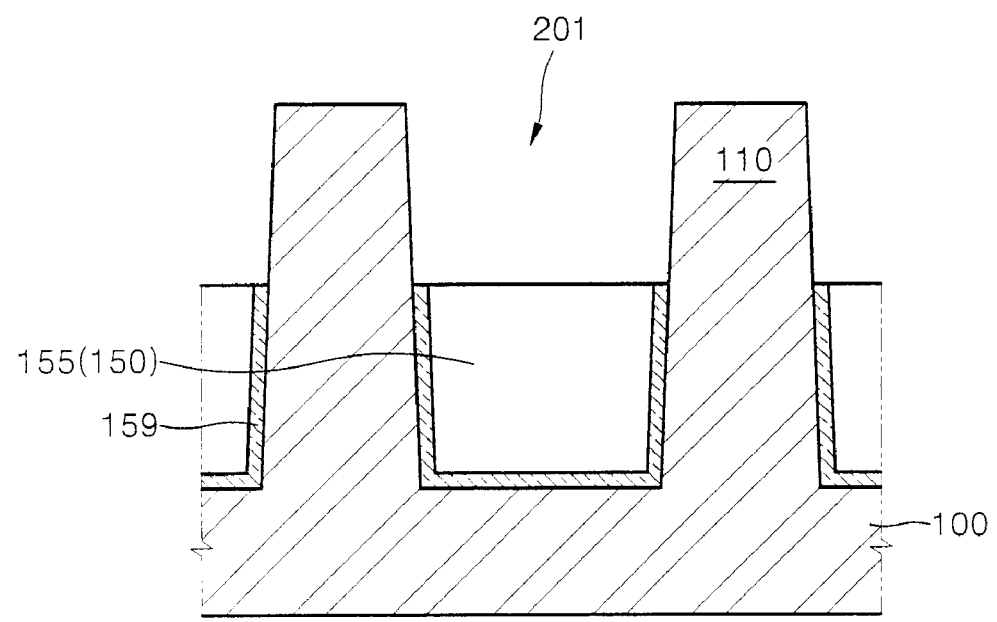

Referring to FIGS. 9A and 9B, portions of the sidewall protection layers 350 exposed at the lateral sides of the recesses 201 and/or the hard masks 330 are selectively removed. In detail, a dry etching process can be performed to selectively remove the hard masks 330. The dry etching process is performed to etch the silicon nitride layer included in each of the hard masks 330 with a specific etch selectivity with respect to the silicon oxide layer included in each of the device isolation regions 150.

In general, a strip process using a wet etching process can be performed to remove such hard masks during a STI process. However, according to the illustrated embodiments of the invention, an anisotropic dry etching process is used to remove the hard masks 330. Hence, it is possible to decrease the height of an oxide bar 158 and to maintain a line width of the oxide bar 158 by preventing the etching of sidewalls of the oxide bar 158.

During the anisotropic dry etching process, the sidewall protection layers 350, which preferably include a silicon nitride layer, can also be removed simultaneously. However, in alternative embodiments a wet etching process can be performed to remove the sidewall protection layers 350. In the wet etching process, an etch solution including phosphoric acid which has a specific etch selectivity for the hard masks 330 with respect to the silicon nitride layer of the sidewall protection layers 350 can be used.

Since the wet etching process has specific etch selectivity for the hard masks 330 with respect to silicon oxide, the erosion of the oxide bar 158, which is a part of the second device separation layers 157 and exists between the recesses 201 by the wet etching process, can be prevented. The sidewall protection layers 350 have small thicknesses of approximately 73 Å. Also, since the wet etching process using phosphoric acid can have an etch selectivity for the hard masks 330 with respect to silicon oxide, the erosion of the oxide bar 158 can be effectively prevented. As a result, the prevention of the undesired loss of the silicon oxide bar 158 makes it further possible to maintain the line widths of the recesses 201.

The patterned portions of the pad layer 310 including the silicon oxide layer and portions of the buffer layer 159 are removed. The patterned portions of the pad layer 310 are exposed by removing the hard masks 330, while the portions of the buffer layer 159 are exposed by removing the sidewall protection layers 350. The buffer layer 159 can be formed in a stack structure including a silicon oxide layer and a silicon nitride layer both formed as liner layers. The silicon nitride layer of the buffer layer 159 can be removed while the sidewall protection layers 350 are removed. Alternatively, the silicon oxide layer of the buffer layer 159 can be removed while the patterned portions of the pad layer 310 are removed.

A strip process for removing silicon oxide can be used to remove the patterned portions of the pad layer 310 and the portions of the buffer layer 159. Since the strip process can be an actual etching process of etching the silicon oxide layer, the device isolation regions 150 including the silicon oxide layers, particularly, the oxide bar 158, can be partially etched during the strip process.

However, since the patterned portions of the pad layer 310 and the portions of the buffer layer 159 are thin, an amount of the oxide bar 158 removed during the strip process is very small. Therefore, the line widths W of the recesses 201 can be practically maintained the same as the initially intended line widths as illustrated in FIG. 7A. Accordingly, the oxide bar 158 can be secured with the line width of approximately 100 nm required by the design rule. As illustrated in FIG. 9B, the fin type active regions 110 are obtained.

Figure 10A:
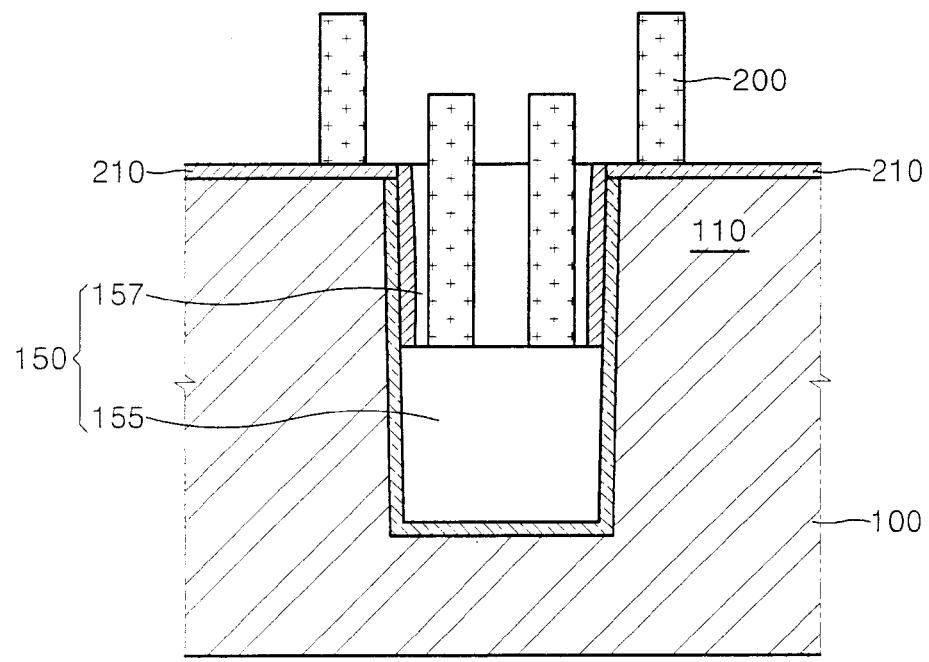
Figure 10B:
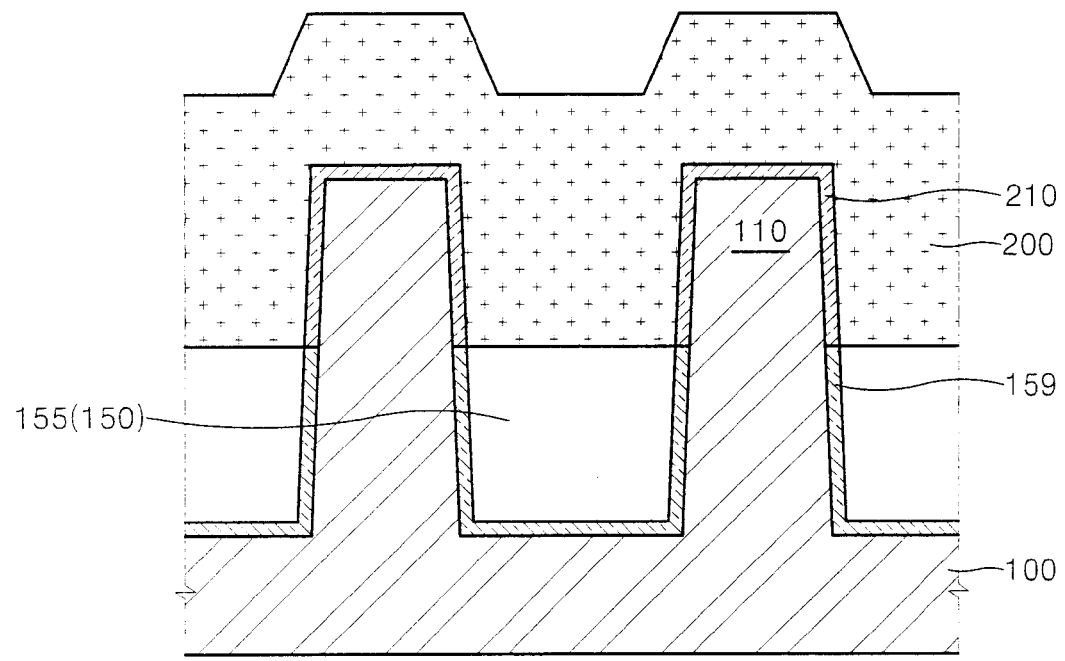

Referring to FIGS. 10A and 10B, gate dielectric layers 210 are formed on the respective active regions 110 and the gates 200 are formed. The gate dielectric layers 210 are formed by growing a dielectric material such as silicon oxide via a thermal oxidation method or depositing such a dielectric material.

A conductive layer fills the recesses 201 to cover the fin type active regions 110. The conductive layer can include polysilicon. The conductive layer is patterned in stripes crossing the active regions 110 as illustrated in FIG. 1, thereby forming the gates 200. The gates 200 can be patterned to be aligned with the recesses 201. Hence, the gates 200 can cover at least the sidewalls and the upper surfaces of the fin type active regions 110.

Although not illustrated, a transistor structure can be formed. In more detail, impurities can be implanted into portions of the fin type active regions 110 exposed by the gates 200 to form junction regions such as source/drain regions. As a result, a FinFET transistor structure can be formed on the substrate 100.

According to embodiments of the invention, when a FinFET transistor structure is formed based on a damascene technique, sidewall protection layers may be formed as spacers on sidewalls of fin type active regions. The sidewall protection layers can include a nitride-based material. Hence, hard masks, which are formed of a silicon nitride layer, and used to form recesses within device isolation regions, and the sidewall protection layers, which are formed of a silicon nitride layer, can be selectively removed by performing dry etching and cleaning processes for nitride.

Since the sidewall protection layers include the nitride-based material, it is possible to prevent unintended erosion of an oxide bar formed between the recesses when the sidewall protection layers are removed. Thus, a line width of the oxide bar can be maintained as required by the design rule. For instance, the oxide bar can have a line width of approximately 100 nm. Accordingly, it is possible to prevent the conventional generation of a bridge between gate lines frequently occurring when the line width of the oxide bar is decreased to less than 10 nm as the oxide bar formed between the recesses is eroded.

The invention may be practiced in many ways. What follows are exemplary, non-limiting descriptions of some embodiments of the invention.

According to some embodiments of the invention, a method of forming a gate of a fin type transistor includes forming hard masks that mask first portions of a substrate to define active regions, forming a first device separation layer on second portions of the substrate exposed by the hard masks, recessing the first device separation layer such that the active regions protrude, thereby exposing sidewalls of the active regions, forming a second device separation layer filling the recessed portions, thereby forming a device isolation region including the first device separation layer and the second device separation layer, forming sidewall protection layers on sidewalls of the protruding active regions prior to forming the second device separation layer, wherein the sidewall protection layers include an insulation material with a specific etch selectivity with respect to an insulation material included in the device isolation region, selectively etching portions of the device isolation region while protecting the active regions using the hard masks and the sidewall protection layers to form a plurality of recesses crossing the device isolation region, selectively removing the hard masks and portions of the sidewall protection layers exposed by the recesses, and forming gate dielectric layers and gates filling the recesses and crossing the active regions.

According to some embodiments, each of the hard masks may include a pad layer including a silicon oxide layer that is disposed underneath the hard masks and a silicon nitride layer formed on the pad oxide layer.

According to some embodiments, forming the first device separation layer includes selectively etching the second portions of the substrate exposed by the hard masks to form a trench, forming a first insulation layer to fill the trench, and performing a CMP (chemical mechanical polishing) process on the first insulation layer using the hard masks as a polishing stop point to form the first device separation layer.

According to some embodiments, recessing of the first device separation layer includes performing an etch-back process on the first device separation layer using the hard masks as an etch mask. The etch-back process may be performed until the depth to which the first device separation layer is etched is equal to the depth of the recesses to be etched.

According to some embodiments, forming the second device separation layer may include forming a second insulation layer filling a gap generated by the recessing of the first device separation layer, and performing a CMP process on the second insulation layer using the hard masks as a polishing stop point to form the second device separation layer.

According to some embodiments, the second insulation layer may include a silicon oxide layer and the sidewall protection layers may include a silicon nitride layer having a specific etch selectivity with respect to the silicon oxide layer of the second device separation layer.

According to some embodiments, forming the sidewall protection layers may include forming a third insulation layer covering the sidewalls of the active regions, and anisotropically dry etching the third insulation layer to pattern the sidewall protection layers in the form of a wing on the sidewalls of the active regions.

According to some embodiments, selective removing of the hard masks and the portions of the sidewall protection layers may include removing the hard masks by a dry etching process, in alternative embodiments removing the portions of the sidewall protection layers may be accomplished through a wet etching process. The wet etching process may use an etch solution that includes phosphoric acid.

According to embodiments of the invention, when the plurality of recesses are formed through a damascene process to realize fin type active regions by exposing sidewalls of the active regions, the widths of the recesses can be precisely controlled. Accordingly, a line width of an oxide bar generated between the recesses can be secured with an initially intended line width.

While the invention has been particularly shown and described with reference to exemplary embodiments thereof, it will be understood by those of ordinary skill in the art that various changes in form and details may be made therein without departing from the spirit and scope of the present invention as defined by the following claims. The inventors regard the subject matter of the invention to include all combinations and subcombinations of the various elements, features, functions and/or properties disclosed herein.

The invention claimed is:

1. A method of forming a gate of a fin type transistor, the method comprising:
   forming hard masks that mask first portions of a substrate and that expose second portions of the substrate, the hard masks defining active regions of the substrate;
   forming a first device separation layer on the second portions of the substrate;
   recessing the first device separation layer to expose sidewalls of the active regions;
   forming a second device separation layer filling the recessed portions, thereby forming a device isolation region including the first device separation layer and the second device separation layer;
   forming sidewall protection layers on sidewalls of the protruding active regions prior to forming the second device separation layer, wherein the sidewall protection layers include an insulation material with a specific etch selectivity with respect to an insulation material included in the device isolation region;
   selectively etching portions of the device isolation region while protecting the active regions using the hard masks and the sidewall protection layers to form a plurality of recesses crossing the device isolation region;
   selectively removing the hard masks and portions of the sidewall protection layers exposed by the recesses; and
   forming gate dielectric layers and gates filling the recesses and crossing the active regions.

2. The method of claim 1, wherein forming the hard masks comprises:
   forming a pad layer between the substrate and the hard masks, the pad layer including a silicon oxide layer; and
   forming a silicon nitride layer on the pad layer.

3. The method of claim 1, wherein forming the first device separation layer comprises:
   etching the second portions of the substrate to form a trench;
   forming a first insulation layer that fills the trench; and
   performing a CMP (chemical mechanical polishing) process on the first insulation layer using the hard masks as a polishing stop point.

4. The method of claim 1, wherein recessing of the first device separation layer comprises performing an etch-back process on the first device separation layer using the hard masks as an etch mask.

5. The method of claim 4, wherein the etch-back process is performed until a depth to which the first device separation layer is etched equals a depth of the recesses to be etched.

6. The method of claim 1, wherein forming the second device separation layer comprises:
   forming a second insulation layer that fills a gap generated by recessing the first device separation layer; and performing a CMP process on the second insulation layer using the hard masks as a polishing stop point to form the second device separation layer.

7. The method of claim 6, wherein the second insulation layer comprises a silicon oxide layer and the sidewall protection layers include a silicon nitride layer having a specific etch selectivity with respect to the silicon oxide layer of the second device separation layer.

8. The method of claim 1, wherein forming the sidewall protection layers comprises:
   forming a third insulation layer that covers the sidewalls of the active regions; and
   anisotropically dry etching the third insulation layer to pattern the sidewall protection layers in the form of a wing on the sidewalls of the active regions.

9. The method of claim 1, wherein selectively removing the hard masks and the portions of the sidewall protection layers comprises:
   removing the hard masks by a dry etching process; and
   removing the portions of the sidewall protection layers by a wet etching process.

10. The method of claim 9, wherein removing the portions of the sidewall protection layers by the wet etching process comprises using an etch solution that includes phosphoric acid.

11. A method of forming a gate of a fin type transistor, the method comprising:
   forming hard masks masking first portions of a substrate to define active regions;
   forming a first device separation layer on second portions of the substrate exposed by the hard masks by performing a STI (shallow trench isolation) process;
   recessing the first device separation layer such that the active regions protrude, thereby exposing sidewalls of the active regions;
   forming a second device separation layer filling the recessed portion, thereby forming a device isolation region that includes the first device separation layer and the second device separation layer;
   forming sidewall protection layers on sidewalls of the protruding active regions prior to forming the second device separation layer, wherein the sidewall protection layers include an insulation material with a specific etch selectivity with respect to an insulation material included in the device isolation region;
   selectively etching portions of the device isolation region while protecting the active regions using the hard masks and the sidewall protection layers to form a plurality of recesses that cross the device isolation region;
   removing the hard masks by performing a dry etching process;
   removing portions of the sidewall protection layers exposed by the recesses by performing a wet etching process; and
   forming gate dielectric layers and gates filling the recesses and crossing the active regions.

12. The method of claim 11, wherein forming the hard masks comprises forming a silicon nitride layer.

13. The method of claim 11, wherein the recessing of the first device separation layer comprises performing an etch-back process on the first device separation layer using the hard masks as an etch mask.

14. The method of claim 13, wherein the etch-back process is performed until a depth to which the first device separation layer is etched equals a depth of the recesses to be etched.

15. The method of claim 11, wherein the second device separation layer includes a silicon oxide layer and the sidewall protection layers include a silicon nitride layer having a specific etch selectivity with respect to the silicon oxide layer of the second device separation layer.

16. The method of claim 15, wherein the wet etching process comprises using an etch solution that includes phosphoric acid.

17. A method comprising:
   forming a pad layer on a substrate the pad layer disposed in physical contact with an upper surface of the substrate;
   forming hard masks on the pad layer, the hard masks covering first portions of the substrate and exposing second portions of the substrate, the first portions of the substrate defining active regions of the substrate;
   etching the pad layer and the second portions of the substrate to form a trench between the active regions of the substrate, the trench having a sidewall and a bottom surface;
   forming a buffer layer in physical contact with the sidewall and the bottom surface of the trench, the buffer layer having a sidewall and a bottom surface;
   filling the trench with a first device separation layer, the first device separation layer in physical contact with the sidewall and the bottom surface of the buffer layer;
   removing a portion of the first device separation layer in the trench to partially expose the sidewall of the buffer layer;
   forming a sidewall protection layer in physical contact with the sidewall of the buffer layer, the sidewall protection layer including a first insulation material;
   filling the trench with a second device separation layer to form a device isolation region that includes the first device separation layer and the second device separation layer, the first insulation material having a specific etch selectivity with respect to a second insulation material that is included in the device isolation region;
   using the hard masks and the sidewall protection layer to protect the active regions, etching the device isolation region to form a recess that crosses the device isolation region, the recess exposing a portion of the hard masks and a portion of the sidewall protection layer;
   removing the portion of the hard masks and the portion of the sidewall protection layer; and
   filling the recess with a gate dielectric layer and a gate.

* * * * *